United States Patent [19]
Matsuzaki

[11] Patent Number: 6,011,700
[45] Date of Patent: *Jan. 4, 2000

[54] SHIELDING CASE

[75] Inventor: Satoru Matsuzaki, Fukushima-ken, Japan

[73] Assignee: Alps Electric Co., Ltd., Tokyo, Japan

[*] Notice: This patent is subject to a terminal disclaimer.

[21] Appl. No.: 08/980,516

[22] Filed: Dec. 1, 1997

[30] Foreign Application Priority Data

Dec. 2, 1996 [JP] Japan .................................. 8-321586

[51] Int. Cl.$^7$ ................................. H05K 5/00; H05K 9/00
[52] U.S. Cl. ........................... 361/816; 361/752; 361/800; 361/818; 174/35 R; 330/68; 334/85
[58] Field of Search .............................. 361/752, 800–802, 361/813–818; 334/85; 330/68; 174/35 R, 35 GC; 439/620, 687

[56] References Cited

FOREIGN PATENT DOCUMENTS 06334375 12/1994 Japan .

*Primary Examiner*—Leo P. Picard
*Assistant Examiner*—Jayprakash N. Gandhi
*Attorney, Agent, or Firm*—Brinks Hofer Gilson & Lione

[57] ABSTRACT

A shielding case eliminates the problem in that the fixing portion of a feed-through capacitor juts out of the cabinet thereof; it does not affect the mounting conditions or the like of internal electronic components even if a part of the cabinet is bent inward to provide a portion on which the feed-through capacitor is mounted; and it enables automated assembly. The shielding case provides all the aforesaid advantages without sacrificing the shielding effect thereof. The shielding case is provided with: a printed circuit board (PCB) (31) which is housed and installed in a cabinet (28) constituted by a frame (23), a top cover (26), and a bottom cover (27); and a feed-through capacitor (29) which has one end thereof soldered to the PCB (31) and the other end thereof led out of the cabinet (28) and which has a fixing portion (36); wherein the top portion of one side surface of the frame (23) is bent inward to provide the side surface of the frame (23) with a horizontal plate portion (32), a mounting hole (33), through which the feed-through capacitor (29) is inserted and secured, is formed in the horizontal plate portion (32), and the edge portion of the PCB (31) is positioned under and opposed to the mounting hole (33) to expose an inserting hole (30) through the mounting hole (33) so as to insert the feed-through capacitor (29) in the mounting hole (33) to secure it.

2 Claims, 3 Drawing Sheets

SHIELDING CASE

BACKGROUND OF THE INVENTION

1. Field of the Invention

The present invention relates to a shielding case from which a leader terminal is led out from a printed circuit board in a cabinet of high-frequency equipment such as a television tuner.

2. Description of Related Art

In a television tuner or other high-frequency equipment, a circuit board on which circuit components have been mounted is housed a cabinet, namely, a shielding case, constituted primarily by a frame, a top cover, and a bottom cover in order to shut out unwanted signals coming from outside and to prevent internal signals from leaking out.

FIG. 6 is a schematic representation illustrating a conventional shielding case.

As shown in FIG. 6, the shielding case is provided with: a frame 1 which constitutes the peripheral side surface of the shielding case, leaving the top and bottom open; a top cover 4 and a bottom cover 5 which are fitted to both open edges of the frame 1 and which respectively cover open sections 2 and 3 of the frame 1; a printed circuit board (hereinafter referred to as "PCB") 7 which is housed and installed in a cabinet 6 composed by the frame 1, the top cover 4, and the bottom cover 5; and a feed-through capacitor 11 which has one end thereof passed through a hole 8 formed in the frame 1 and further inserted in an inserting hole, not shown, of the PCB 7 and attached by solder 9 and the other end thereof led out of the frame 1, i.e. the cabinet 6, and which has a fixing portion 10 secured to the frame 1.

The feed-through capacitor 11, which is also called a "feed-through type ceramic capacitor," is employed to shield circuitry so as to prevent the leakage of high-frequency power in a high-frequency amplifier, a high-frequency oscillator, or the like; it is provided to short-circuit high-frequency signals to the ground when introducing DC power through a shielding plate. An external electrode of the feed-through capacitor 11 is screwed to or directly soldered to the shielding plate. The feed-through capacitor of this type has a relatively large capacitance and it is expected to provide satisfactory grounding effect even in the VHF band.

In the conventional example illustrated in FIG. 6, the hole through which the feed-through capacitor 11 is inserted is provided in the frame. In another conventional example set forth below, the hole through which the feed-through capacitor 11 is provided in the bottom cover 5, or the top cover 4.

FIG. 7 is a schematic representation showing another conventional shielding case.

As shown in FIG. 7, the shielding case is equipped with: a frame 1 which constitutes the peripheral side surface of the shielding case, leaving the top and bottom thereof open; a top cover 4 and a bottom cover 5 which are fitted to both open edges of the frame 1 and which respectively cover open sections 2 and 3 of the frame 1; a PCB 7 which is housed and installed in a cabinet 6 composed by the frame 1, the top cover 4, and the bottom cover 5; and a feed-through capacitor 11 which has one end thereof passed through a hole 12 formed in the bottom cover 5 or the top cover 4 and further inserted in an inserting hole, not shown, of the PCB 7 and attached by solder 9 and the other end thereof led out of the bottom cover 5, i.e. the cabinet 6, and which has a fixing portion 10 secured to the bottom cover 5.

In the conventional examples described above, however, since the fixing portion 10 of the feed-through capacitor 11 is secured to the outer surface of the frame 1 or the bottom cover 5, the fixing portion 10 juts out of the cabinet, making it difficult to reduce the installation space. In the conventional example shown in FIG. 6, the feed-through capacitor 11 is installed through the hole 8 of the frame 1, making it difficult to install it from above or under the frame 1. This has been making it difficult to achieve automated assembly.

SUMMARY OF THE INVENTION

Accordingly, it is an object of the present invention to provide a shielding case which allows a feed-through capacitor or a feed-through terminal to be connected to a PCB in a cabinet, which does not adversely affect the shielding effect, which does not have a fixing portion jutting out of the cabinet as in conventional shielding cases, which does not affect the mounting or the like of internal electronic components even if the cabinet is provided with a horizontal plate as mentioned above, and which permits the PCB to be installed from below the frame thereof and also permits the feed-through capacitor or the feed-through terminal to be installed from above a mounting hole, thus enabling automated assembly of the shielding case.

To this end, according to the present invention, there is provided a shielding case provided with: a frame constituting the peripheral side surface of the shielding case such that it leaves the top and bottom thereof open; a top cover and a bottom cover which are respectively fitted onto the top edge and the bottom edge of the frame and which respectively cover the top and bottom open sections of the frame; a PCB which is housed and installed in a cabinet constituted by the frame, the top cover, and the bottom cover and which is provided with an inserting hole in an edge portion thereof through which a core wire of a feed-through capacitor or a feed-through terminal is inserted; and a feed-through capacitor or a feed-through terminal which has one end thereof soldered to the PCB and the other end thereof led out of the cabinet, and which has a fixing portion secured to the cabinet; wherein the top portion of one side surface of the frame is bent inward to provide the side surface of the frame with a horizontal plate portion, a mounting hole is formed in the horizontal plate portion, and the edge portion of the PCB is opposed to the horizontal plate portion to expose the inserting hole through the mounting hole so as to insert the fixing portion of the feed-through capacitor or the feed-through terminal in the mounting hole to secure it.

In a preferred form of the present invention, the frame is formed into a square shape, and a plurality of the aforesaid mounting holes are formed over the entire width of the frame.

DESCRIPTION OF THE PREFERRED EMBODIMENTS

An embodiment of the present invention will be explained.

Figure 1:
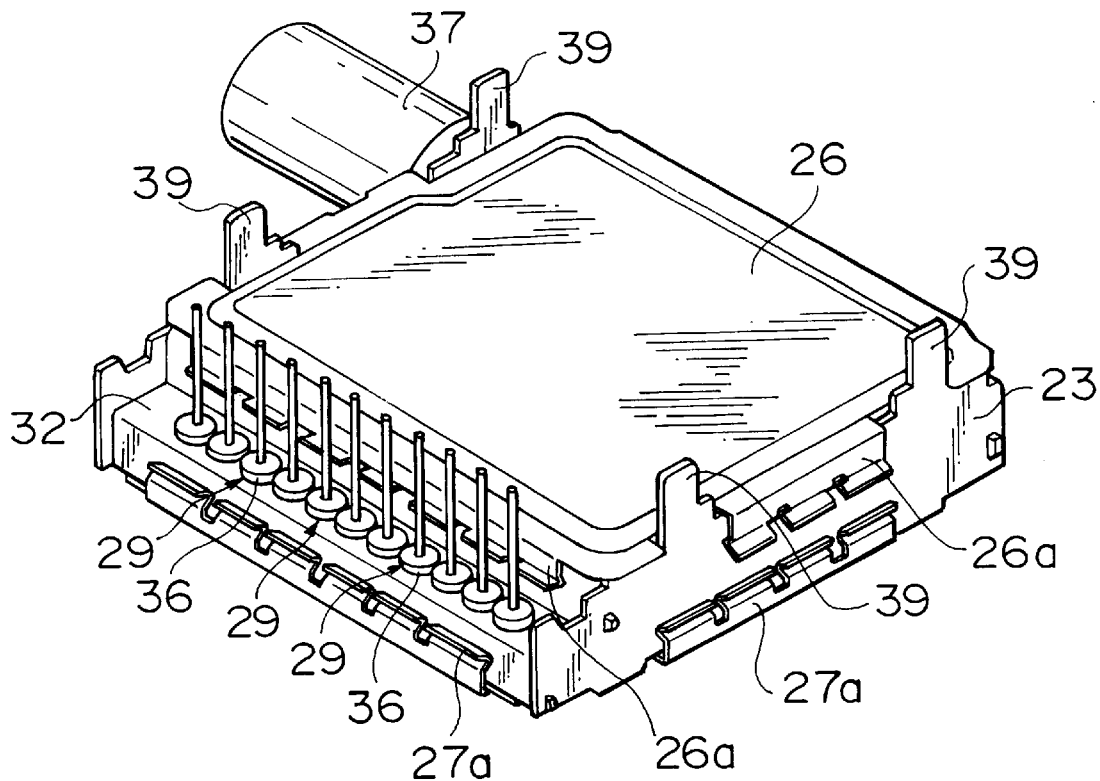
FIG. 1 is a perspective view illustrating an embodiment of a shielding case in accordance with the present invention.
Figure 2:
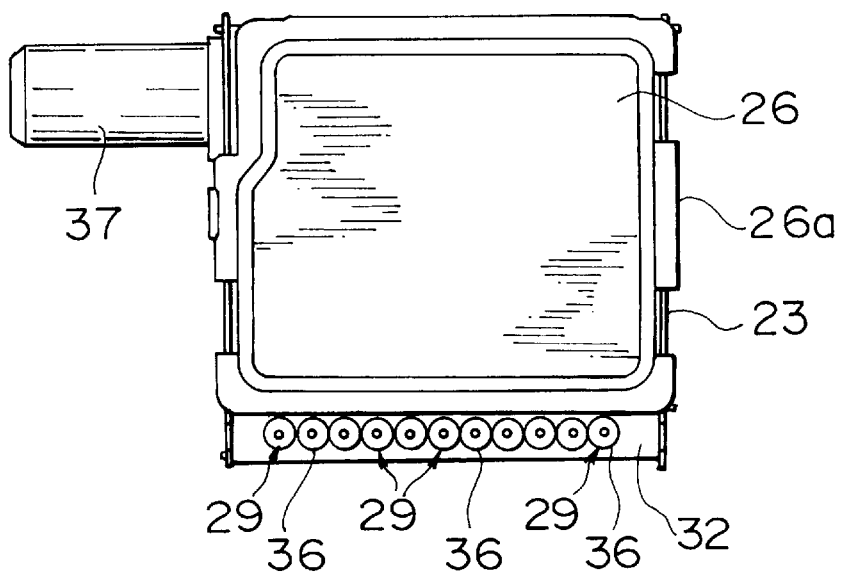
FIG. 2 is a top view illustrating the shielding case of FIG. 1.
Figure 3:
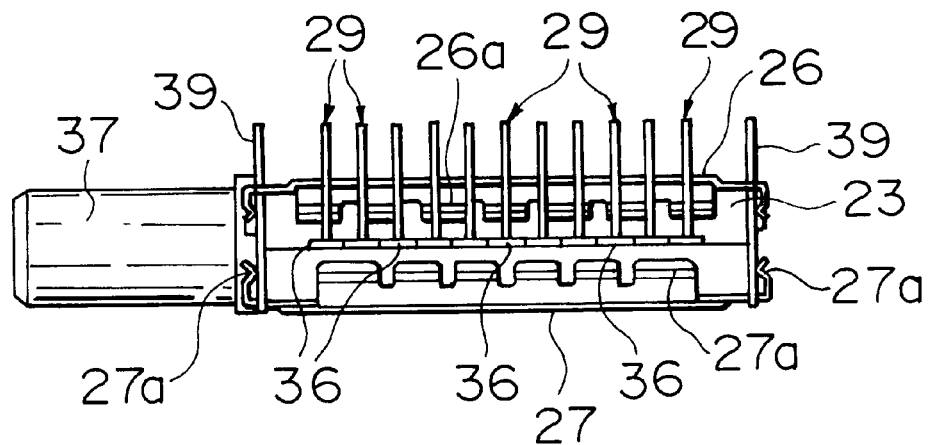
FIG. 3 is a front view illustrating the shielding case of FIG. 1.
Figure 4:
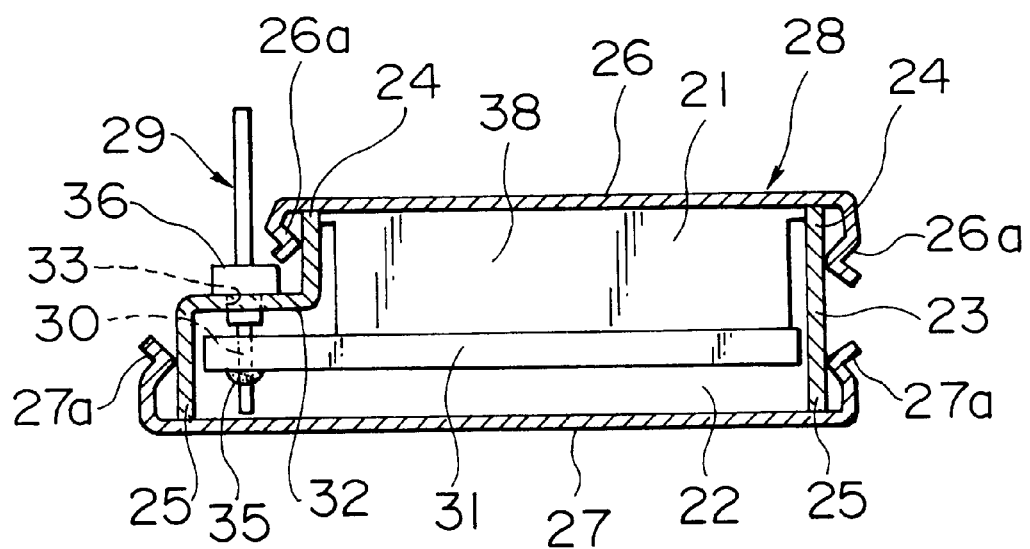
FIG. 4 longitudinal sectional view illustrating an essential section of the shielding case of FIG. 1.
Figure 5:
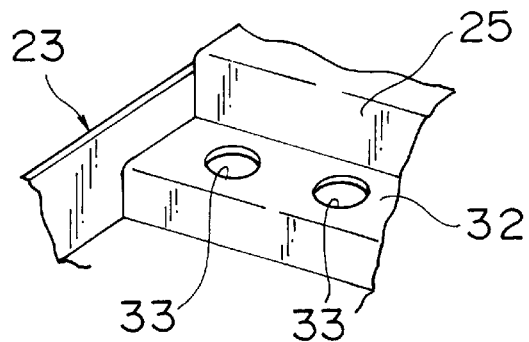
FIG. 5 is a perspective view illustrating an essential section of the frame of the shielding case of FIG. 1.
Figure 6:
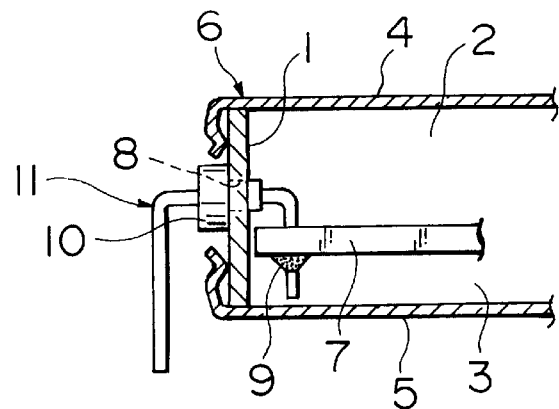
FIG. 6 is a schematic representation illustrating an essential section of a conventional shielding case.
Figure 7:
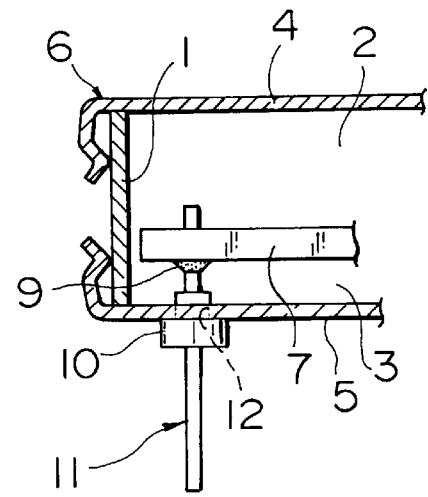
FIG. 7 a schematic representation illustrating an essential section of another conventional shielding case.

FIG. 1 is a perspective view showing an embodiment of the shielding case in accordance with the present invention; FIG. 2 is a top plan view illustrating the shielding case of FIG. 1; FIG. 3 is a front view illustrating the shielding case of FIG. 1; FIG. 4 is a longitudinal sectional view illustrating an essential section of the shielding case of FIG. 1; and FIG. 5 is a perspective view illustrating an essential section of the frame of the shielding case of FIG. 1.

As shown in these drawings, the shielding case of high-frequency equipment is provided with: a square frame 23 which constitutes the peripheral side surface of the shielding case to form a top open section 21 and a bottom open section 22; a top cover 26 and a bottom cover 27 which are fitted onto top and bottom edge portions 24 and 25 of the frame 23 to respectively cover the open sections 21 and 22; and a printed circuit board (hereinafter referred to as "PCB") 31 which is housed and installed in a space formed by a cabinet 28 composed of the frame 23, the top cover 26, and the bottom cover 27 and which is provided with inserting holes 30 for the connection of the core wires of feed-through capacitors 29.

The top portion, namely, the top edge portion 24, of one side surface of the frame 23 is bent inward to provide a horizontal plate section 32, on which the feed-through capacitors are mounted, on the side surface of the frame 23. As illustrated in FIG. 1 through FIG. 3, a plurality of mounting holes 33 are formed in the horizontal plate section 32 over the entire width of the frame 23.

As shown in FIG. 4, the PCB 31 in the cabinet 28 is installed from under the frame 23, an edge thereof being opposed to the bottoms of the mounting holes 33 such that it covers them. The edge of the PCB 31 is provided with inserting holes 30 which are matched to the mounting holes 33 and in which the core wires of the feed-through capacitors 29 are inserted, the respective inserting holes 30 being exposed.

Hence, the core wire of one end of each of the feed-through capacitors 29 is inserted from above the frame 23 (the cabinet 28) into each of the inserting holes 30 of the PCB 31 which is exposed through each of the mounting holes 33, and it is fixed with solder 35, thus connecting the feed-through capacitors 29 to the pattern of the PCB 31 as illustrated in FIG. 4.

The feed-through capacitor 29 is provided with a fixing portion 36; as shown in FIG. 4, the fixing portion 36 of each feed-through capacitor 29 is secured by being fitted into each mounting hole 33. In other words, each feed-through capacitor 29 is secured to the frame 23 by the fixing portion 36 which is secured to the horizontal plate section 32.

In this embodiment, the fixing portions 36 of the feed-through capacitors 29 are provided on the horizontal plate section 32 formed by bending the top portion of one side surface of the frame 23 inward; therefore, the fixing portion 36 does not jut out of the cabinet 28 as it used to in the conventional examples. Moreover, as previously mentioned, the horizontal plate section 32 does not adversely affect the mounting condition or the like of the internal electronic components.

As set forth above, the top cover 26 and the bottom cover 27 are fitted to the top edge portion 24 and the bottom edge portion 25, respectively, to cover the open sections 21 and 22; however, the top and bottom edge portions 24 and 25 allow the areas where engaging hooks 26a and 27a of the top cover 26 and the bottom cover 27, respectively, are engaged as shown in FIG. 1.

The embodiment further includes a joint 37 to which an antenna connecting cord is connected; a PCB mounting board 38 formed on the frame by bending it; and a mounting frame leg 39 formed on the frame 23.

The procedure for assembling the foregoing embodiment will now be described. First, the PCB 31 having electronic components mounted on is put into the frame 23 from below the frame 23 as shown in FIG. 4, then an edge of the PCB 31 is positioned and installed under the mounting holes 33 as shown in FIG. 4. At this time, the PCB 31 can be positioned without slanting it, that is, it can be moved into the frame while holding it horizontal to the frame 23. After that, as illustrated in FIG. 4, the core wire of one end of each feed-through capacitor 29 is inserted in the inserting hole 30 of the PCB 31, which inserting hole is exposed through the mounting hole 33, from above the frame 23. Next, the fixing portion 36 is secured by fitting it in the mounting hole 33, and the core wire on one end of the feed-through capacitor 29 is attached by the solder 35 so as to connect it to the pattern of the PCB 31. Then, the top cover 26 and the bottom cover 27 are fitted to the top and bottom edge portions 24 and 25, respectively, of the frame 23 to cover the open sections 21 and 22, thus completing the shielding case shown in FIG. 1.

The embodiment explained above has employed the feed-through capacitors 29; however, feed-through terminals may be employed instead. When feed-through terminals are used, the insulated portions thereof corresponding to the fixing portions 36 of the feed-through capacitors 29 may be secured by fitting them in the mounting holes 33.

In the embodiment set forth above, the shielding case is provided with: the frame 23 constituting the peripheral side surface of the shielding case such that it leaves the top and bottom thereof open; the top cover 26 and the bottom cover 27 which are respectively fitted onto the top edge portion and the bottom edge portion of the frame 23 and which respectively cover the top and bottom open sections 21 and 22 of the frame 23; the PCB 31 which is housed and installed in the cabinet 28 constituted by the frame 23, the top cover 26, and the bottom cover 27 and which is provided with inserting holes in an edge portion thereof through which the core wires of the feed-through capacitors or feed-through terminals are inserted; and the feed-through capacitors 29 or the feed-through terminals which have one end thereof soldered to the PCB 31 and the other end thereof led out of the cabinet 28, and which have the fixing portions 36 secured to the cabinet 28; wherein the top portion of one side surface of the frame 23 is bent inward to provide the side surface of the frame 23 with the horizontal plate portion 32, the mounting holes 33 are formed in the horizontal plate portion 32, and the edge portion of the PCB 31 is positioned under and opposed to the horizontal plate portion 32 to expose the inserting holes 30 through the mounting holes 33 so as to insert the fixing portions 36 in the mounting holes 33 to secure them; and the frame 23 is formed into the square shape, and a plurality of the mounting holes 33 are formed over the entire width of the frame 23. Thus, the fixing portions 36 are secured by inserting them in the mounting holes 33 thereby to plug up the mounting holes 33, enabling the connection to the PCB 31 in the cabinet 28 without adversely affecting the shielding effect. Moreover, the top portion of one side surface of the frame 23 is bent to provide the horizontal plate section 32 where the mounting holes 33 are formed. This solves the problem of the jutting out of the fixing portions 36 in the conventional examples. The presence of the horizontal plate section provided on the cabinet 28 does not affect the mounting conditions or the like of the internal electronic components. There is also another advantage in that the PCB 31 can be installed from below the frame 23, and the feed-through capacitors or the feed-through terminals can be installed from above the mounting holes, thus permitting automated assembly.

In the embodiment explained above, the terms "top" cover, "bottom" cover, or the "top" or "bottom" of the side surface of the frame have been used merely for the purpose of convenience; the present invention will not be affected even if the top cover and the bottom cover are reversed, and/or the top and the bottom of the side surface of the frame are reversed.

Thus, according to the present invention, the mounting holes of the frame through which the feed-through capacitors or feed-through terminals are inserted are covered by the edge portion of the PCB thereby to enable the connection to the PCB in the cabinet without adversely affecting the shielding effect. Moreover, since the mounting holes are formed in the horizontal plate section provided on the side surface of the frame, the fixing portion does not jut out of the cabinet as it used to in the conventional shielding cases. The presence of the horizontal plate section provided on the cabinet as mentioned above does not affect the mounting conditions or the like of the internal electronic components. There is also another advantage in that the PCB can be installed from below the frame, and the feed-through capacitors or the feed-through terminals can be installed from above the mounting holes, thus permitting automated assembly.

What is claimed is:
1. A shielding case comprising:
   a frame constituting the peripheral side surface of said shielding case such that it leaves the top and bottom thereof open;
   a top cover and a bottom cover which are respectively fitted onto the top edge and the bottom edge of said frame and which respectively cover the top and bottom open sections of said frame;
   a printed circuit board which is housed and installed in a cabinet constituted by said frame, said top cover, and said bottom cover and which is provided, in an edge portion thereof, with an inserting hole into which a core wire of a feed-through capacitor or a feed-through terminal is inserted; and
   a feed-through capacitor or a feed-through terminal which has one end thereof soldered to said printed circuit board and the other end thereof led out of said cabinet, and which has a fixing portion secured to said cabinet;
   wherein the top portion of one side surface of said frame is bent inward to provide the side surface of said frame with a horizontal plate portion, and a mounting hole is formed in said horizontal plate portion, and
   an edge portion of said printed circuit board is opposed to said horizontal plate portion to expose said inserting hole through said mounting hole so as to insert said fixing portion of said feed-through capacitor or said feed-through terminal in said mounting hole to secure it.
2. A shielding case according to claim 1, wherein said frame is formed into a square shape, and a plurality of said mounting holes are formed over the entire width of said frame.

* * * * *